(12) United States Patent
Xu et al.

(10) Patent No.: US 10,622,593 B2
(45) Date of Patent: Apr. 14, 2020

(54) REDUCTION OF PACKAGING PARASITIC INDUCTANCE IN POWER MODULES

(71) Applicant: Ford Global Technologies, LLC, Dearborn, MI (US)

(72) Inventors: Zhuxian Xu, Novi, MI (US); Guangyin Lei, Canton, MI (US); Nevin Altunyurt, Atlanta, GA (US); Chingchi Chen, Ann Arbor, MI (US)

(73) Assignee: Ford Global Technologies, LLC, Dearborn, MI (US)

(*) Notice: Subject to any disclaimer, the term of this patent is extended or adjusted under 35 U.S.C. 154(b) by 128 days.

(21) Appl. No.: 16/000,398

(22) Filed: Jun. 5, 2018

(65) Prior Publication Data

US 2019/0372063 A1 Dec. 5, 2019

(51) Int. Cl.
*H01M 2/02* (2006.01)
*H01M 2/04* (2006.01)
*B60R 16/04* (2006.01)
*H02J 1/10* (2006.01)
*H01M 2/20* (2006.01)

(52) U.S. Cl.
CPC ............. *H01M 2/024* (2013.01); *B60R 16/04* (2013.01); *H01M 2/04* (2013.01); *H01M 2/206* (2013.01); *H02J 1/10* (2013.01)

(58) Field of Classification Search
CPC ........ H01M 2/024; H01M 2/04; H01M 2/206; B60R 16/04; H02J 1/10
See application file for complete search history.

(56) References Cited

U.S. PATENT DOCUMENTS

| | | | |
|---|---|---|---|
| 8,536,701 B2 | 9/2013 | Tain et al. | |
| 10,141,254 B1* | 11/2018 | Xu | ............. H01L 25/18 |
| 2013/0307147 A1 | 11/2013 | Liu | |
| 2015/0236607 A1* | 8/2015 | Zhao | ........... H02G 5/06 |
| | | | 361/752 |
| 2017/0279366 A1* | 9/2017 | Kimura | ............ H01L 25/07 |
| 2017/0317006 A1* | 11/2017 | Okumura | ............ H01L 25/18 |
| 2017/0364194 A1 | 12/2017 | Jang et al. | |
| 2018/0056795 A1* | 3/2018 | Xu | ........... H03K 17/567 |

* cited by examiner

*Primary Examiner* — Jared Fureman
*Assistant Examiner* — Duc M Pham
(74) *Attorney, Agent, or Firm* — David Kelley; Brooks Kushman, P.C.

(57) ABSTRACT

A power module includes a packaging structure having a pair of side-by-side spaced apart busbars, each connected to a corresponding switch. The power module includes a conductive pad, between and electrically isolated from the busbars and the switches, and configured to, responsive to flow of current through the busbars generated by the switches and resulting in power loop magnetic flux between the busbars, generate magnetic flux that partially cancels the power loop magnetic flux.

20 Claims, 4 Drawing Sheets

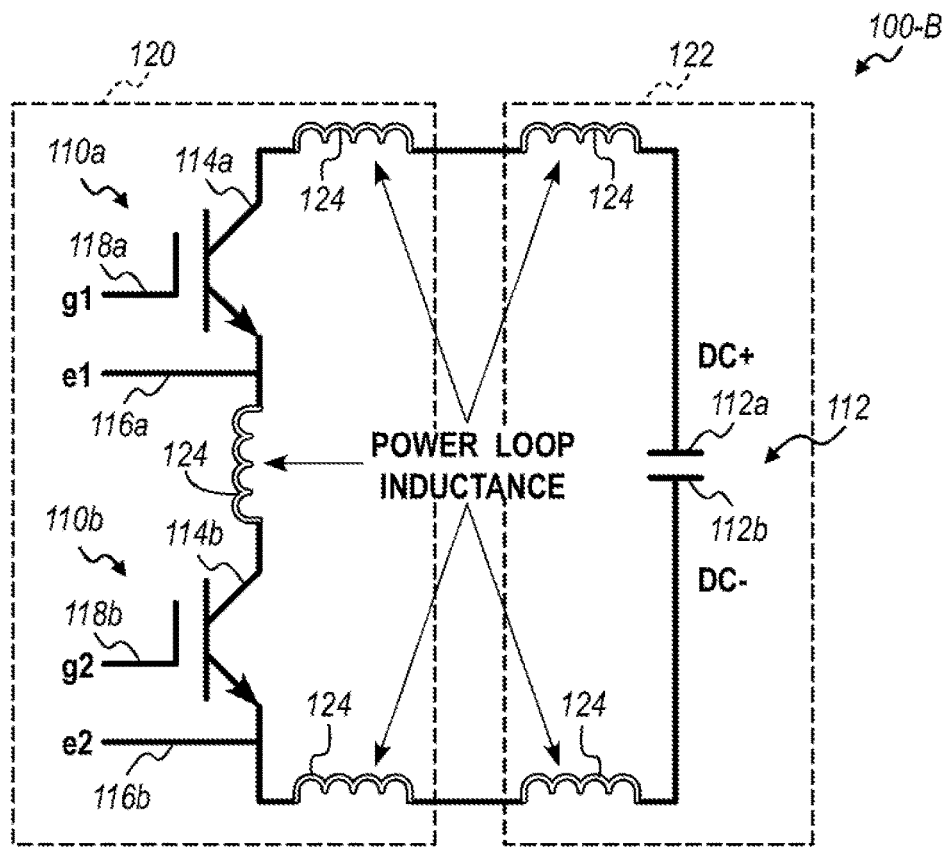
FIG. 1B
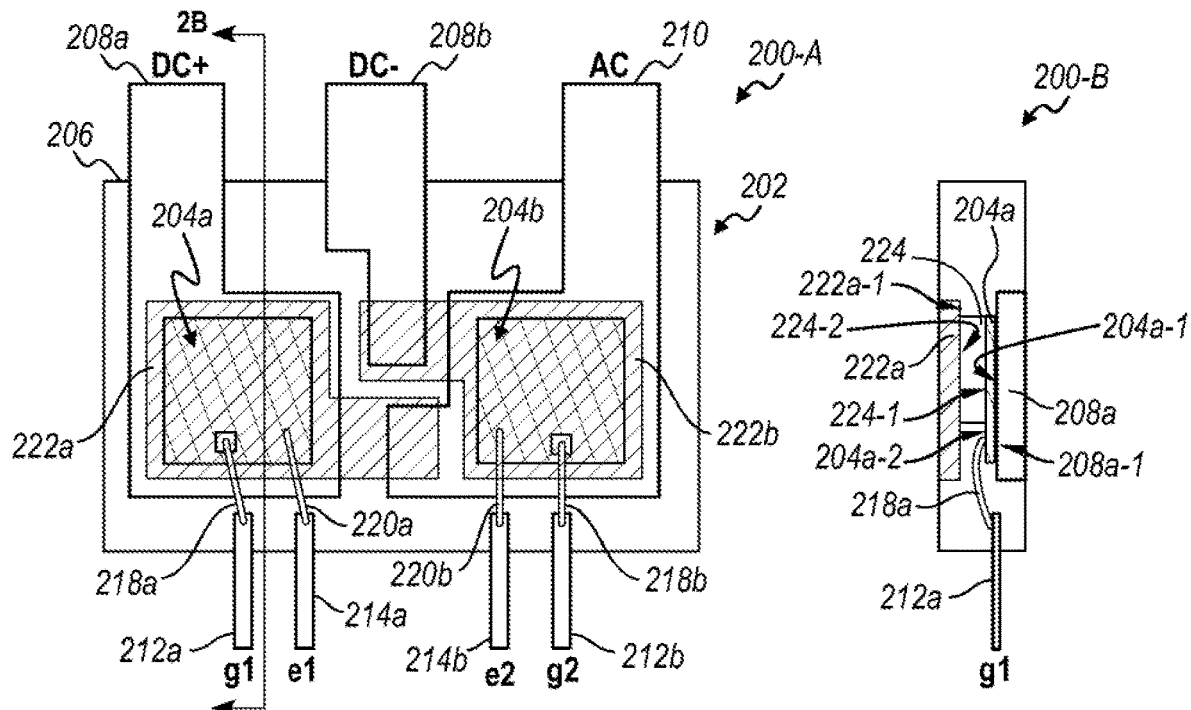
FIG. 2A  FIG. 2B

REDUCTION OF PACKAGING PARASITIC INDUCTANCE IN POWER MODULES

TECHNICAL FIELD

The present disclosure relates to systems and methods for reducing packaging parasitic inductance in power modules.

BACKGROUND

The term "electric vehicle" can be used to describe vehicles having at least one electric motor for vehicle propulsion, such as battery electric vehicles (BEV) and hybrid electric vehicles (HEV). A BEV includes at least one electric motor, wherein the energy source for the motor is a battery that is re-chargeable from an external electric grid. An HEV includes an internal combustion engine and one or more electric motors, wherein the energy source for the engine is fuel and the energy source for the motors is a battery. The HEV battery may be a larger capacity battery that is rechargeable from the external electric grid and may serve as the main source of energy for vehicle propulsion until the battery depletes to a low energy level, at which time the HEV may at least partly rely on the internal combustion engine for vehicle propulsion.

SUMMARY

A power module includes a packaging structure having a pair of side-by-side spaced apart busbars, each connected to a corresponding switch, and a conductive pad, between and electrically isolated from the busbars and the switches, and configured to, responsive to flow of current through the busbars generated by the switches and resulting in power loop magnetic flux between the busbars, generate magnetic flux that partially cancels the power loop magnetic flux.

An inverter includes a power module including a packaging structure, a pair of side-by-side spaced apart busbars disposed on the structure, and a conductive pad arranged such that current flow through the busbars induces power loop magnetic flux between the busbars and Eddy currents in the pad that generate magnetic flux that opposes the power loop magnetic flux.

A power module for an inverter includes a pair of side-by-side spaced apart busbars electrically connected with one another and each connected to a corresponding switch, and a conductive pad disposed between and electrically isolated from the busbars and the switches, and configured to, responsive to flow of current through the busbars generated by the switches and resulting in power loop magnetic flux between the busbars, generate magnetic flux that opposes the power loop magnetic flux.

BRIEF DESCRIPTION OF THE DRAWINGS

FIG. 1B is a block diagram of an inverter power module illustrating packaging inductance;

FIG. 2A is a block diagram illustrating a top view of the power module layout;

FIG. 2B is a block diagram illustrating a cross-section view of the power module layout;

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

An example hybrid electric vehicle (HEV) may comprise a hybrid transmission mechanically connected to an engine and a drive shaft driving wheels. In some examples, the hybrid transmission may also be mechanically connected to one or more electric machines capable of operating as a motor or a generator. In a pure electric vehicle, e.g., battery electric vehicle (BEV), the hybrid transmission may be a gear box connected to the electric machine and the engine may not be present.

A power module of an inverter may include a plurality of switching semiconductor elements, as well as, capacitors and other electrical components. When closed, one or more inverter switches may form a power loop and may configured to transfer electric energy to and from the inverter and the traction battery. The power loop electrical circuit formed when one or more switches are closed may generate stray inductance, or a distributed parasitic inductance parameter intrinsic to one or more components of the power module, a DC-link capacitor and busbars.

The power loop stray inductance may affect operation of switching semiconductor elements, e.g., insulated gate bipolar junction transistors (IGBTs), metal-oxide semiconductor field effect transistors (MOSFETs), and so on. In one example, stray inductance may cause voltage overshoot during switching of the switching elements, thereby, resulting in a premature wear or failure of the switches.

Figure 1A:
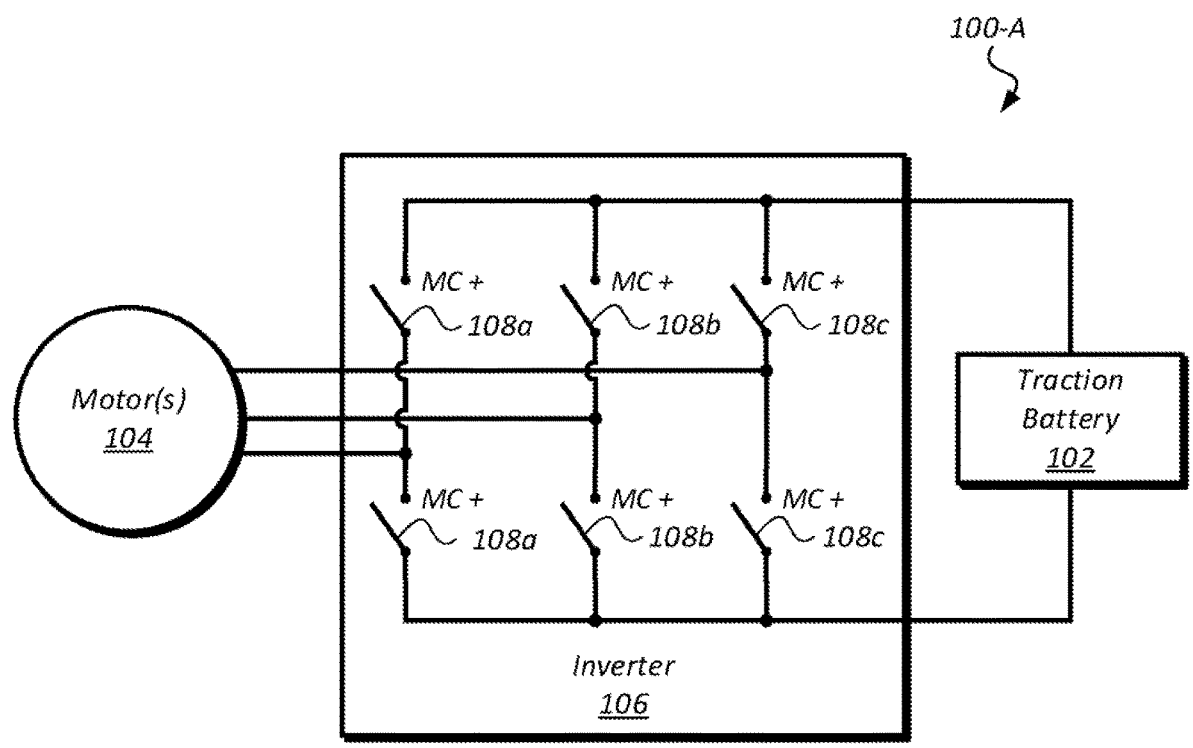
FIG. 1A is a block diagram illustrating an inverter of a hybrid electric vehicle (HEV)

FIG. 1A illustrates an example power switch arrangement 100-A of an inverter 106. The electric machines 104 may be electrically connected to the inverter 106 providing bi-directional energy transfer between the electric machines 104 and at least one traction battery 102. For example, in a motor mode, the inverter 106 may convert direct current (DC) output provided by the traction battery 102 to a three-phase alternating current (AC) as may be required for proper functionality of the electric machines 104. As another example, in a regenerative mode, the inverter 106 may convert the three-phase AC output from the electric machines 104 acting as generators to the DC voltage required by the traction battery 102.

In one example, the inverter 106 may include a plurality of power switches 108 configured to provide the three-phase voltages/currents to the electric machines 104. When closed, the power switches 108 may be configured to transfer voltage from a high-voltage DC bus to a corresponding phase input of the electric machines 104. A first pair of switches 108a may be configured to selectively couple a DC bus power and return terminals to a first phase input of the electric machine 104. A second and third pair of switches 108b, 108c may selectively couple corresponding DC bus power and return terminals to the second and third phase inputs of the electric machine 104, respectively.

The switches 108 may include one or more power switching devices. As one example, each of the switches 108 may include one or more IGBTs, MOSFETs, and other solid-state switching devices. Each switch 108 may further include a corresponding control input (e.g., gate input) by which the switch 108 may be operated to switch on and off, or closed and open. Corresponding control inputs of each switch 108 may be electrically coupled to one or more controllers of the vehicle. Accordingly, each of the phase inputs of the electric machine 104 may be selectively coupled to the terminals of the traction battery 102 by a pair of the switches 108. As one example, the switches 108 may be operated such that only one switch 108 of each of the pairs 108a, 108b, and 108c is switched on at a given time.

FIG. 1B illustrates an example power loop circuit arrangement 100-B for the inverter 106. The circuit arrangement 100-B may include a power module portion 120 and a DC link capacitor and busbar portion 122. The power module 120 may include a plurality of power semiconductor switches 110 connected electrically in series with one another and electrically in series with a DC link capacitor 112. One or more switches 110, when closed, may complete an electrical circuit with the DC link capacitor 112, e.g., via the busbars, and may be configured to transfer electric energy between the inverter 106 and the traction battery 102. In some instances, the DC link capacitor 112 may be a film capacitor.

While not separately illustrated herein, the inverter 106 may include more or fewer power modules 120 and DC link capacitors 112, as well as, one or more other power devices, main circuit busbars, a power module drive circuit board, a motor control circuit board, three-phase current sensors, DC and AC connectors, and other electrical components. The switches 110 may be configured to transfer a predefined current value and may have an associated power rating sufficient to operate the electric machine 104 to meet corresponding power and torque requests.

Each of the switches 110 may include a plurality of terminals that control current flow through the switch 110. For example, the switch 110 may be an IGBT-type switch and may include a collector (C) terminal 114 connected to a positive terminal 112a of the capacitor 112 and an emitter (E) terminal 116 connected to a negative terminal 112b of the capacitor 112. In some instances, the switch 110 may be a MOSFET-type switch and may include a drain (D) terminal, a source (S) terminal, and so on. Additionally or alternatively, the switches 110 may be other types of semiconductor devices. A corresponding gate (G) terminal 118 of each of the switches 110 may be a control input of that switch 108. In one example, the gate (G) terminal 118 may be a connected with one or more vehicle controllers (not illustrated) through gate drivers configured to monitor and control operation of the switch 110.

The power loop 100-B electrical circuit, formed when one or more switches 110 are closed, may generate stray inductance 124, or a distributed parasitic inductance parameter intrinsic to one or more components of the power module portion 120, the DC link capacitor and busbars portion 122, and so on. The power loop 100-B stray inductance 124 may affect operation of the switches 110, such as, but not limited to, causing voltage overshoot during switching of the switches 110, thereby, resulting in a premature wear or failure of the switches 110.

FIG. 2A illustrates a top view 200-A of an example power module 202 of the inverter 106. The power module 202 may include a packaging structure 206 configured to receive a pair of switches 204, a pair of DC busbars 208, and an AC busbar 210. The packaging structure 206 may be plastic and may be configured to spatially position the switches 204, the DC busbars 208, the AC busbar 210, and other components of the power module 202 with respect to one another. The packaging structure 206 may further be one of a protective casing, a molding, and so on configured to house one or more components of the power module 202. The switches 204 may be representative of a layout of the switches 110 described in reference to at least FIG. 1B. Each switch 204 may be a silicon die and may include a gate terminal 212, an emitter terminal 214, and a collector terminal (not illustrated).

The DC busbars 208a, 208b and the AC busbar 210 may be configured to extent outside a bottom copper lead frame (not illustrated) of the power module 202 to electrically connect the power module 202 to the DC link capacitor 112 through busbars. The switch 204a may be disposed on and electrically connected to the positive DC busbar 208a and the switch 204b may be disposed on and electrically connected to the AC busbar 210. The corresponding gate and Kelvin emitter terminals 212, 214 of each switch 204 may be connected to the body of the switch 204 using bond wires 218, 220, respectively.

As described in reference to at least FIG. 2B, a corresponding copper spacer 224 may be disposed about one side of each of the switches 204a, 204b. In some instances, one copper spacer 224 may separate at least a portion of a first top copper lead frame portion 222a from both the first switch 204a and the positive DC busbar 208a and another copper spacer 224 may separate at least a portion of a second top copper lead frame portion 222b from both the second switch 204b and the AC busbar 210. Additionally or alternatively, at least a portion of the first top copper lead frame portion 222a may be electrically connected to the AC busbar 210 and at least a portion of the second top copper lead frame portion 222b may be electrically connected to the negative DC busbar 208b. The respective connections between the first top copper lead frame portion 222a and busbar 210 and the second top copper lead frame portion 222b and busbar 208b may be configured to transfer current flow from the positive DC busbar 208a to the negative DC busbar 208b. Accordingly, some portions of the top copper lead frame portions 222a, 222b may extend outward beyond outer edges of the switches 204a, 204b and the copper spacers 224 to make electrical connections and complete electric circuit as described herein.

FIG. 2B illustrates a cross-section view 200-B of the power module 202. The switch 204a may be disposed between the positive DC busbar 208a and the first top copper lead frame portion 222a. The copper spacer 224 may be disposed between at least a portion of the first top copper lead frame portion 222a and the switch 204a. In one example, a first side 204a-1 of the switch 204a may be adjacent to and/or in contact with a top portion 208a-1 of the positive DC busbar 208a. In another example, a second side 204a-2 of the switch 204a opposite the first side 204a-1 may be adjacent to and/or in contact with a first side 224-1 of the copper spacer 224. In still another example, a second side 224-2 of the copper spacer 224 opposite the first side 224-1 may be adjacent to and/or in contact with at least a portion of a first side 222a-1 of the first top copper lead frame portion 222a. Although not separately illustrated, the layout of the copper spacer 224, the first switch 204a, and at least a portion of the first top copper lead frame portion 222a relative one another may also be applicable to the relative positioning between the copper spacer 224, the second switch 204b, and at least a portion of the second top copper lead frame portion 222b.

Figure 3:
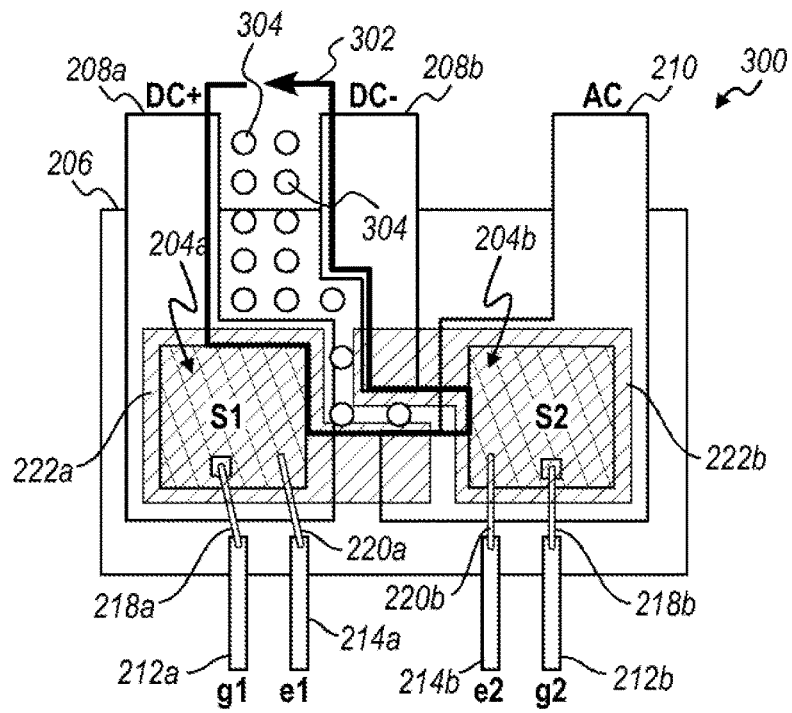
FIG. 3 is a block diagram illustrating path of a power loop current.

FIG. 3 illustrates an example diagram 300 of current path 302 in the power module 202. In on example, the power loop current flows 302 though the conductive path from the positive DC busbar 208a to the negative DC busbar 208b. The flow of current 302 may induce magnetic flux 304. In some instances, direction of the magnetic flux 304 may be determined using a right-hand rule. For instances, curling fingers of a right hand in a direction of the power loop current may indicate that the direction of the magnetic flux 304 is perpendicular to the path of the power loop current and out of the page.

The power loop stray inductance $L_s$ can then be calculated with the following equation:

$$L_s = \frac{\Phi}{I}, \quad (1)$$

where $\Phi$ is the magnetic flux, and I is the power loop current. The power circuit inductance may include the power module's 202 internal inductance, busbar 208 inductance, and capacitor 112 internal inductance.

Figure 4A:
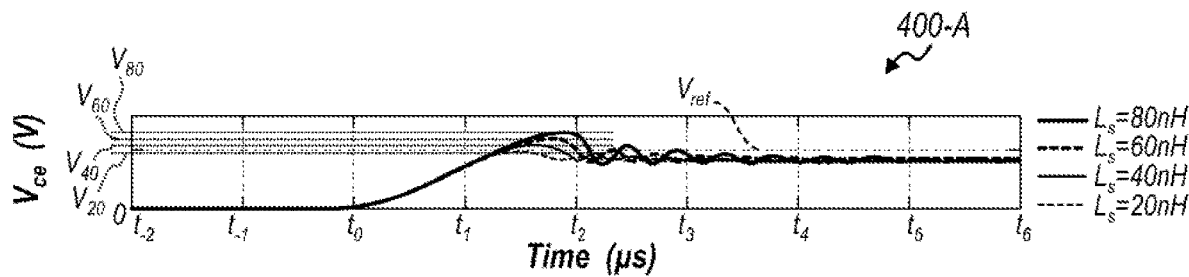
FIGS. 4A and 4B are graphs illustrating switch behavior under various stray inductance values.
Figure 4B:
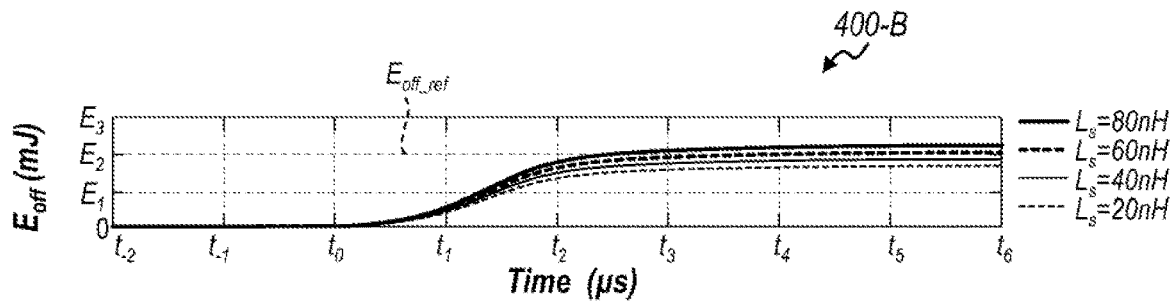

FIGS. 4A and 4B illustrate example graphs 400 indicative of a turn-off behavior of the switch 204 given various power loop stray inductance $L_s$ values. FIG. 4A illustrates a voltage graph 400-A, such that a maximum collector-emitter voltage $V_{ce}$ of the switch 204 may increase with respect to a reference voltage $V_{ref}$ as the stray inductance $L_s$ increases. For example, the maximum collector-emitter voltage $V_{20}$, occurring when $L_s$ is approximately equal 20 nH, is less than the reference voltage $V_{ref}$. As another example, the maximum collector-emitter voltage $V_{80}$, occurring when $L_s$ is approximately equal 80 nH, is greater than the reference voltage $V_{ref}$.

FIG. 4B illustrates a turn-off energy $E_{off}$ graph 400-B, such that a maximum turn-off energy value $E_{off}$ of the switch 204 may increase with respect to a reference turn-off energy $E_{off\_ref}$ as the stray inductance $L_s$ increases. For example, the maximum turn-off energy $E_{20}$, occurring when $L_s$ is approximately equal 20 nH, is less than both the reference turn-off energy $E_{off\_ref}$ and the maximum turn-off energy $E_{40}$, occurring when $L_s$ is approximately equal 40 nH, and so on. As another example, the maximum turn-off energy $E_{80}$, occurring when $L_s$ is approximately equal 80 nH, is greater than each of the reference turn-off energy $E_{off\_ref}$, the maximum turn-off energy $E_{60}$, occurring when $L_s$ is approximately equal 60 nH, the maximum turn-off energy $E_{40}$, occurring when $L_s$ is approximately equal 40 nH, and the maximum turn-off energy $E_{20}$, occurring when $L_s$ is approximately equal 20 nH.

Thus, reducing the power loop stray inductance $L_s$ may improve operation of the switches 204. Methods of reducing the stray inductance $L_s$ include optimizing pin locations and overlaying the positive and negative DC busbar 208 terminals of each power module 202.

Figure 5A:
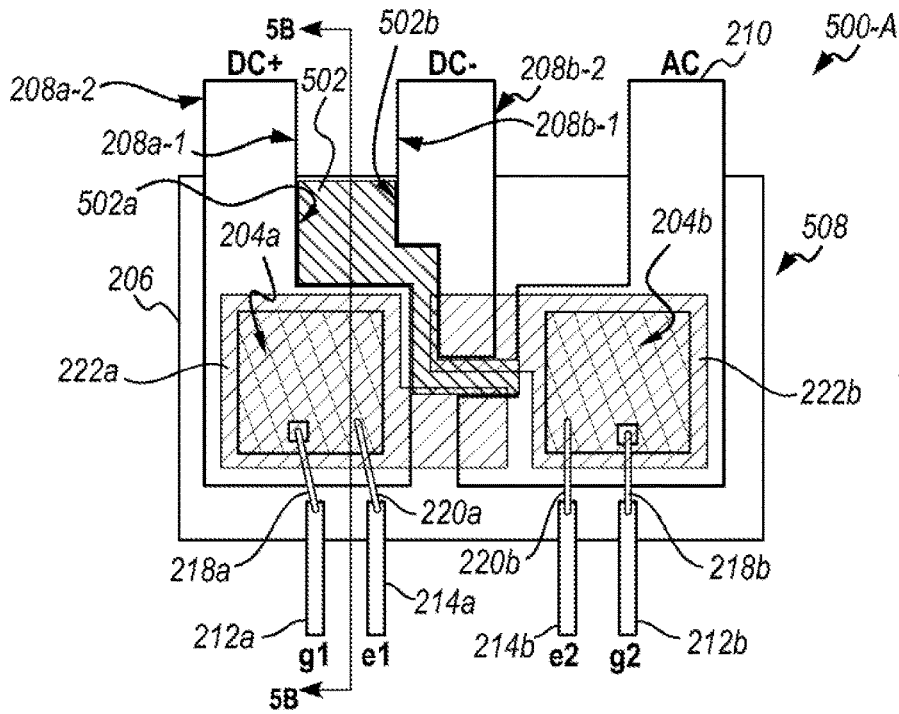
FIG. 5A is a block diagram illustrating a top view of the power module including a conductive pad.

FIG. 5A illustrates a top view 500-A of an example power module 508 having lower stray inductance $L_s$ during a flow of current through the power module 508. A conductive pad 502 may be disposed between the DC busbars 208 and further between the pair of switches 204. Each busbar 208 includes top and bottom portions 208-1, 208-2, respectively, disposed opposite one another. In one example, the corresponding top portions 208-1 of the positive and negative DC busbars 208a, 208b are adjacent to one another. The conductive pad 502 may include a first pad side 502a and a second pad side 502b disposed opposite the first pad side 502a. In some instances, the first pad side 502a of the conductive pad 502 may be adjacent to the first positive DC busbar side 208a-1 and the second pad side 502b of the conductive pad 502 may be adjacent to the first negative DC busbar side 208b-1.

The conductive pad 502 may be electrically isolated from the switches 204 and electrically isolated from the DC busbars 208, AC busbar 210, and other components of the power module 508. The conductive pad 502 may, in some instances, be implemented using a metal pad or by installing a copper plane on either a flexible or non-flexible printed circuit board (PCB).

Figure 5B:
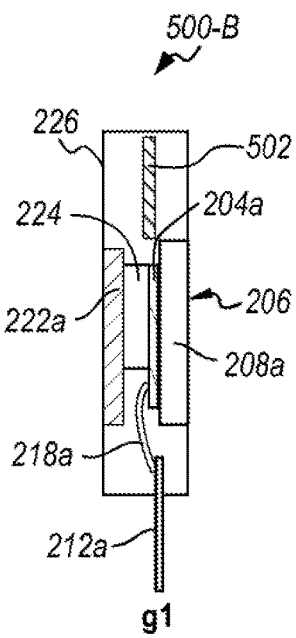
FIG. 5B is a block diagram illustrating a cross-section view of the power module with the conductive pad.

FIG. 5B illustrates a cross-section view 500-B of the power module 508 having lower stray inductance $L_s$ during power current flow. In one example, the conductive pad 502 may be electrically isolated from each of the switches 204, the DC busbars 208, the AC busbar 210, and the packaging structure 206. In another example, the conductive pad 502 may be electrically isolated from all other components of the power module 508.

Figure 6:
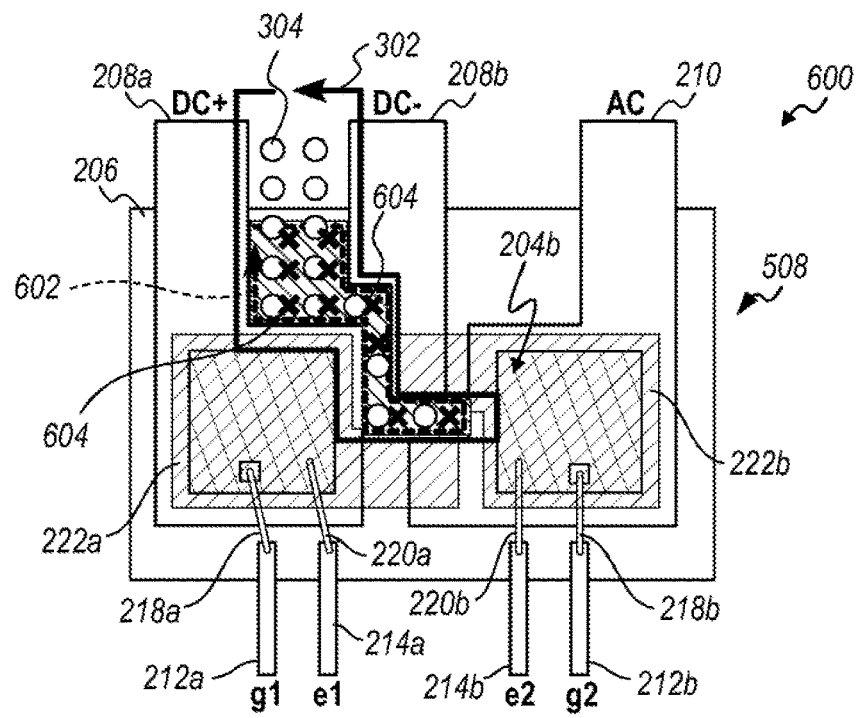
FIG. 6 is a block diagram illustrating paths of the power loop and Eddy currents.

FIG. 6 illustrates an example diagram 600 of the current path 302 in the power module 508. In one example, the power loop current flows 302 through the conductive path from the positive DC busbar 208a to the negative DC busbar 208b, e.g., via the first and second top copper lead frame portions 222a, 222b. The magnetic flux 304 induced by the power loop current flow 302 may be directed perpendicular to the path of the power loop current and out of the page, as generally indicated by circles 304.

The magnetic flux 304 may further induce Eddy current 602 in the conductive pad 502 disposed between the DC busbars 208 and further between the pair of switches 204. In one example, the Eddy current 602 may generate a corresponding magnetic field 604 having a direction that opposes the direction of the power loop magnetic field 304. The conductive pad magnetic flux 604 may reduce or partially cancel the power loop magnetic flux 304. In another example, the direction of the Eddy current loop 602 may be into the page, as generally indicated by X's 604.

The processes, methods, or algorithms disclosed herein may be deliverable to or implemented by a processing device, controller, or computer, which may include any existing programmable electronic control unit or dedicated electronic control unit. Similarly, the processes, methods, or algorithms may be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms may also be implemented in a software executable object. Alternatively, the processes, methods, or algorithms may be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

The words used in the specification are words of description rather than limitation, and it is understood that various changes may be made without departing from the spirit and scope of the disclosure. As previously described, the features of various embodiments may be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A power module comprising:
a packaging structure including a pair of side-by-side spaced apart busbars, each connected to a corresponding switch; and
a conductive pad, between and electrically isolated from the busbars and the switches, and configured to, responsive to flow of current through the busbars generated by the switches and resulting in power loop magnetic flux between the busbars, generate magnetic flux that partially cancels the power loop magnetic flux.

2. The module of claim 1, wherein the pad is a printed circuit board with a copper plane.

3. The module of claim 1, wherein the pad is a metal pad.

4. The module of claim 1, wherein the flow of current is via corresponding lead frame portions, each connected to a different one of the busbars.

5. The module of claim 4, wherein the pad is electrically isolated from the lead frame portions.

6. The module of claim 4, wherein the switches are silicon dies, each of the switches having one side disposed adjacent to a corresponding one of the busbars and another side disposed adjacent to the lead frame portion.

7. The module of claim 4 further comprising two copper spacers, each disposed between at least a portion of the lead frame and a corresponding one of the switches.

8. An inverter comprising:
a power module including a packaging structure, a pair of side-by-side spaced apart busbars disposed on the structure, and a conductive pad arranged such that current flow through the busbars induces power loop magnetic flux between the busbars and Eddy currents in the pad that generate magnetic flux that opposes the power loop magnetic flux.

9. The inverter of claim 8, wherein the pad is electrically isolated from the busbars and the structure.

10. The inverter of claim 8, wherein the pad is a printed circuit board including a copper plain.

11. The inverter of claim 8, wherein the pad is a metal pad.

12. The inverter of claim 8, wherein the current flow is generated by a pair of semiconductor switches and wherein each of the switches is connected to a different one of the busbars.

13. The inverter of claim 12, wherein the pad is electrically isolated from the switches.

14. The inverter of claim 12 further comprising a DC link capacitor configured to charge and discharge according to operation of the switches.

15. A power module for an inverter comprising:
a pair of busbars electrically connected with one another and each connected to a corresponding switch; and
a conductive pad disposed between and electrically isolated from the busbars and the switches, and configured to, responsive to flow of current through the busbars generated by the switches and resulting in power loop magnetic flux between the busbars, generate magnetic flux that opposes the power loop magnetic flux.

16. The module of claim 15, wherein the pad is a printed circuit board with a copper plane or a metal pad.

17. The module of claim 15 further comprising a lead frame portion disposed about a first side of one of the switches opposite a second side, that is electrically connected to the corresponding busbar, wherein at least a portion of the lead frame portion extends beyond outer edges of the switch to electrically connect to a different one of the busbars.

18. The module of claim 17, wherein the pad is electrically isolated from the lead frame portion.

19. The module of claim 17, wherein each of the switches is sandwiched between a corresponding one of the busbars and at least a portion of the corresponding lead frame portion.

20. The module of claim 19 further comprising two copper spacers, each disposed between the corresponding switch and the corresponding lead frame portion.

* * * * *